United States Patent
Kang

(10) Patent No.: US 11,747,404 B2
(45) Date of Patent: Sep. 5, 2023

(54) APPARATUS AND METHOD FOR DETECTING THERMAL RUNAWAY OF BATTERY FOR ELECTRIC VEHICLE

(71) Applicants: Hyundai Motor Company, Seoul (KR); Kia Corporation, Seoul (KR)

(72) Inventor: Hyunchang Kang, Seoul (KR)

(73) Assignees: Hyundai Motor Company, Seoul (KR); Kia Corporation, Seoul (KR)

(*) Notice: Subject to any disclaimer, the term of this patent is extended or adjusted under 35 U.S.C. 154(b) by 71 days.

(21) Appl. No.: 17/323,245

(22) Filed: May 18, 2021

(65) Prior Publication Data

US 2022/0163598 A1    May 26, 2022

(30) Foreign Application Priority Data

Nov. 24, 2020    (KR) .................... 10-2020-0158502

(51) Int. Cl.
| | |
|---|---|
| G01R 31/00 | (2006.01) |
| G01R 31/396 | (2019.01) |
| G01R 31/3835 | (2019.01) |
| H01M 10/48 | (2006.01) |
| H01M 10/42 | (2006.01) |
| H02J 7/00 | (2006.01) |

(52) U.S. Cl.
CPC ....... *G01R 31/396* (2019.01); *G01R 31/3835* (2019.01); *H01M 10/425* (2013.01); *H01M 10/4285* (2013.01); *H01M 10/482* (2013.01); *H01M 10/486* (2013.01); *H01M 10/488* (2013.01); *H01M 2010/4271* (2013.01); *H01M 2220/20* (2013.01); *H02J 7/0029* (2013.01)

(58) Field of Classification Search
USPC .......................................... 324/426, 433–435
See application file for complete search history.

(56) References Cited

U.S. PATENT DOCUMENTS

| | | | |
|---|---|---|---|
| 2021/0190881 A1* | 6/2021 | Lee ..................... | H01M 10/425 |
| 2022/0085436 A1* | 3/2022 | Engle .................. | H01M 10/48 |

FOREIGN PATENT DOCUMENTS

| | | |
|---|---|---|
| KR | 100964175 B1 | 6/2010 |
| KR | 101965447 B1 | 4/2019 |
| KR | 102123684 B1 | 6/2020 |

* cited by examiner

*Primary Examiner* — Vincent Q Nguyen
(74) *Attorney, Agent, or Firm* — Fox Rothschild LLP

(57) ABSTRACT

An apparatus and method of detecting a thermal runaway of a battery for an electric vehicle are provided. The apparatus includes a plurality of battery cells that are connected in series through a high voltage (HV) line and a battery module including the plurality of battery cells. A plurality of main sensing lines are electrically connected to the HV line between the plurality of battery cells to measure voltages of respective battery cells. A plurality of auxiliary sensing lines are respectively connected to an HV line as an input line of the battery module and to an HV line as an output line of the battery module to measure a voltage of the battery module.

15 Claims, 6 Drawing Sheets

APPARATUS AND METHOD FOR DETECTING THERMAL RUNAWAY OF BATTERY FOR ELECTRIC VEHICLE

CROSS-REFERENCE TO RELATED APPLICATION

This application claims priority to and the benefit of Korean Patent Application No. 10-2020-0158502 filed on Nov. 24, 2020, the entire contents of which are incorporated herein by reference.

BACKGROUND

(a) Field of the Disclosure

The present disclosure relates to an apparatus and method for detecting a thermal runaway of a battery for an electric vehicle, and more particularly, to an apparatus and method for detecting a thermal runaway of a battery for an electric vehicle that rapidly detects a thermal runaway of a battery provided in the electric vehicle to notify an occupant of the thermal runaway.

(b) Description of the Related Art

An electric vehicle is a vehicle that uses a battery powered engine operated by electrical energy outputted from a battery. Since such an electric vehicle uses a battery in which a plurality of secondary cells capable of being charged and discharged are formed as a single pack as a main power source, it has the advantage of no emissions and minimal noise. In addition, a hybrid vehicle is a vehicle that uses two or more power sources, for example, both an internal combustion engine and a battery powered engine, as an intermediate vehicle between a vehicle using an internal combustion engine and an electric vehicle.

In the vehicle using electrical energy as described above, since performance of the battery directly affects performance of the vehicle, a battery management system is required to efficiently manage charging and discharging of each battery cell by measuring a voltage of each battery cell, and a voltage and current of all batteries, and to ensure maximum performance of the battery cell by determining whether each battery cell is degraded. Recently, the use of lithium-ion batteries in such electric vehicles is increasing. The lithium-ion battery is a type of rechargeable battery, and has a multilayer structure including a positive electrode activated by various mixed oxides or olivine, a negative electrode activated by a specific carbon, and a separator immersed in an organic electrolyte.

In a normal operation state thereof, electrical energy is converted and stored as chemical energy during charging, and the stored chemical energy is converted into electrical energy during discharging. In particular, during charging, lithium in the positive electrode is ionized to move layer by layer toward the negative electrode. During discharging, ions move to the positive electrode to return to their original compound. In such a lithium-ion battery, a state known as self-heating may occur in extreme situations of overvoltage, overcurrent, or overtemperature. Due to the self-heating, the lithium-ion battery may enter a thermal runaway state. The self-heating means a state in which a temperature inside a battery cell rises due to an electrical-chemical structure inside the battery cell.

When the thermal runaway occurs inside a battery module, it may cause very extreme and severe damage. When the thermal runaway occurs, a minimal amount of oxygen may be generated and an internal temperature may rise to 800 degrees Celsius or more. When such a situation occurs, a fire may occur inside the vehicle, excessive gas may be generated, or a case in which a lithium-ion battery cell is accommodated may be destroyed. Particularly, when a fire occurs, it may cause very serious damage to a driver in the vehicle.

The above information disclosed in this section is merely for enhancement of understanding of the background of the disclosure, and therefore it may contain information that does not form the prior art that is already known in this country to a person of ordinary skill in the art.

SUMMARY

The present disclosure provides an apparatus for detecting a thermal runaway of a battery for an electric vehicle that may detect a thermal runaway of a battery for an electric vehicle and warn an occupant of the vehicle of a danger thereof.

An exemplary embodiment of the present disclosure provides an apparatus of detecting a thermal runaway of a battery for an electric vehicle, including: a plurality of battery cells connected in series through a high voltage (HV) line; a battery module including the plurality of battery cells; a plurality of main sensing lines electrically connected to the HV line between the plurality of battery cells to measure voltages of respective battery cells; and a plurality of auxiliary sensing lines respectively connected to an HV line as an input line of the battery module and to an HV line as an output line of the battery module to measure a voltage of the battery module.

A voltage of all the battery cells may be detected by summing voltages of respective battery cells detected through the main sensing line; a voltage of the battery module detected through the auxiliary sensing line may be detected; and a controller configured to compare the voltage of all the battery cells and the voltage of the battery module to determine whether the battery cell is abnormal may be further included.

The controller may be configured to determine that all the battery cells of the battery module normally operate when the voltage of all the battery cells and the voltage of the battery module are the same. The controller may be configured to determine whether the battery cell is abnormal by comparing the voltage of the battery module detected through the auxiliary sensing line with a normal module voltage, when the voltage of all the battery cells and the voltage of the battery module are different.

The controller may be configured to determine that an abnormality occurs in the main sensing line when the voltage of the battery module detected through the auxiliary sensing line is the same as the normal module voltage. The controller may be configured to determine that an abnormal situation occurs in the battery cell when the voltage of the battery module detected through the auxiliary sensing line is different by a predetermined voltage or more from the normal module voltage.

The apparatus of detecting the thermal runaway of the battery for the electric vehicle may further include a warning part configured to provide a notification to an occupant of an abnormality in the main sensing line or an abnormality in the battery cell.

Another embodiment of the present disclosure provides a method of detecting a thermal runaway of a battery for an electric vehicle, wherein the electric vehicle includes a battery module having a plurality of battery cells connected in series through a high voltage (HV) line, including: detecting voltages of respective battery cells through a plurality of main sensing lines electrically connected to the HV line; detecting a voltage of all the battery cells by summing the voltages of respective battery cells; detecting a voltage of the battery module through a plurality of auxiliary sensing lines electrically connected to the HV line; and determining an abnormality of the battery cell and an abnormality of the main sensing line by comparing the voltage of all the battery cells and the voltage of the battery module.

The method of detecting the thermal runaway of the battery for the electric vehicle may further include determining that the battery cell and the main sensing line normally operate when the voltage of all the battery cells and the voltage of the battery module are the same. The method of detecting the thermal runaway of the battery for the electric vehicle may further include, in response to determining that the voltage of all the battery cells and the voltage of the battery module are different, comparing the voltage of the battery module detected through the auxiliary sensing line with a normal module voltage.

The method of detecting the thermal runaway of the battery for the electric vehicle may further include, in response to determining that the voltage of the battery module detected through the auxiliary sensing line is the same as the normal module voltage, determining that an abnormality occurs in the main sensing line. The method of detecting the thermal runaway of the battery for the electric vehicle may further include, in response to determining that the voltage of the battery module detected through the auxiliary sensing line is different by a predetermined voltage or more from the normal module voltage, determining that an abnormal situation occurs in the battery cell. The method of detecting the thermal runaway of the battery for the electric vehicle may further include notifying an occupant of an abnormality in the main sensing line or an abnormality in the battery cell.

Another exemplary embodiment of the present disclosure provides an apparatus of detecting a thermal runaway of a battery for an electric vehicle, including: a plurality of main sensing lines electrically connected to a high voltage (HV) line between a plurality of battery cells to measure voltages of the plurality of battery cells connected in series; a plurality of auxiliary sensing lines respectively connected to an HV line as an input line of a battery module and to an HV line as an output line of the battery module to measure a voltage of the battery module; a battery management system configured to detect voltages of respective battery cells through the main sensing line and detect a voltage of the battery module through the auxiliary sensing line; and a controller configured to determine whether the main sensing line is abnormal through the voltages of respective battery cells and the voltage of the battery module, wherein the controller may be configured to execute a series of instructions that include detecting a voltage of all the battery cells by summing the voltages of respective battery cells, and determining an abnormality of the battery cell and an abnormality of the main sensing line by comparing the voltage of all the battery cells and the voltage of the battery module.

The controller may be configured to determine that the battery cell and the main sensing line normally operate when the voltage of all the battery cells and the voltage of the battery module are the same. The controller may further be configured to perform, when the voltage of all the battery cells and the voltage of the battery module are different, comparing the voltage of the battery module detected through the auxiliary sensing line with a normal module voltage.

The controller, in response to determining that the voltage of the battery module detected through the auxiliary sensing line is the same as the normal module voltage, may be configured to determine that an abnormality occurs in the main sensing line. The controller, in response to determining that the voltage of the battery module detected through the auxiliary sensing line is different by a predetermined voltage or greater from the normal module voltage, may be configured to determine that an abnormal situation occurs in the battery cell.

According to the apparatus and method of detecting the thermal runaway of the battery for the electric vehicle according to the exemplary embodiment of the present disclosure as described above, it is possible to detect an abnormal situation (for example, thermal runaway) of a battery cell and an abnormal situation of a main sensing line by comparing a voltage of all battery cells detected through the main sensing line with a voltage of a battery module detected through an auxiliary sensing line. In addition, since there is no need to include a separate temperature sensor for detecting the thermal runaway, it is possible to reduce a manufacturing cost of a vehicle.

BRIEF DESCRIPTION OF THE DRAWINGS

These drawings are for reference only in describing exemplary embodiments of the present disclosure, and therefore, the technical idea of the present disclosure should not be limited to the accompanying drawings.

DETAILED DESCRIPTION

Figure 1:
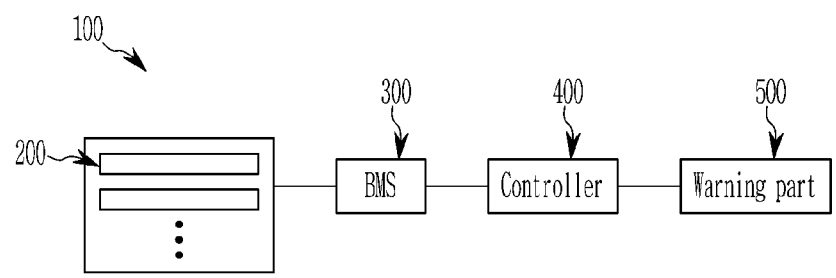
FIG. 1 illustrates a block diagram of an apparatus of detecting a thermal runaway of a battery for an electric vehicle according to an exemplary embodiment of the present disclosure.

The present disclosure will be described more fully hereinafter with reference to the accompanying drawings, in which embodiments of the disclosure are shown. As those skilled in the art would realize, the described embodiments may be modified in various different ways, all without departing from the spirit or scope of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogenpowered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

Although exemplary embodiment is described as using a plurality of units to perform the exemplary process, it is understood that the exemplary processes may also be performed by one or plurality of modules. Additionally, it is understood that the term controller/control unit refers to a hardware device that includes a memory and a processor and is specifically programmed to execute the processes described herein. The memory is configured to store the modules and the processor is specifically configured to execute said modules to perform one or more processes which are described further below.

Furthermore, control logic of the present disclosure may be embodied as non-transitory computer readable media on a computer readable medium containing executable program instructions executed by a processor, controller/control unit or the like. Examples of the computer readable mediums include, but are not limited to, ROM, RAM, compact disc (CD)-ROMs, magnetic tapes, floppy disks, flash drives, smart cards and optical data storage devices. The computer readable recording medium can also be distributed in network coupled computer systems so that the computer readable media is stored and executed in a distributed fashion, e.g., by a telematics server or a Controller Area Network (CAN).

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

In order to clearly describe the present disclosure, parts that are irrelevant to the description are omitted, and identical or similar constituent elements throughout the specification are denoted by the same reference numerals. In addition, since the size and thickness of each configuration shown in the drawings are arbitrarily shown for convenience of description, the present disclosure is not necessarily limited to configurations illustrated in the drawings, and in order to clearly illustrate several parts and areas, enlarged thicknesses are shown.

Hereinafter, an apparatus for detecting a thermal runaway of a battery for an electric vehicle according to an exemplary embodiment of the present disclosure will be described in detail with reference to the accompanying drawings.

Figure 2:
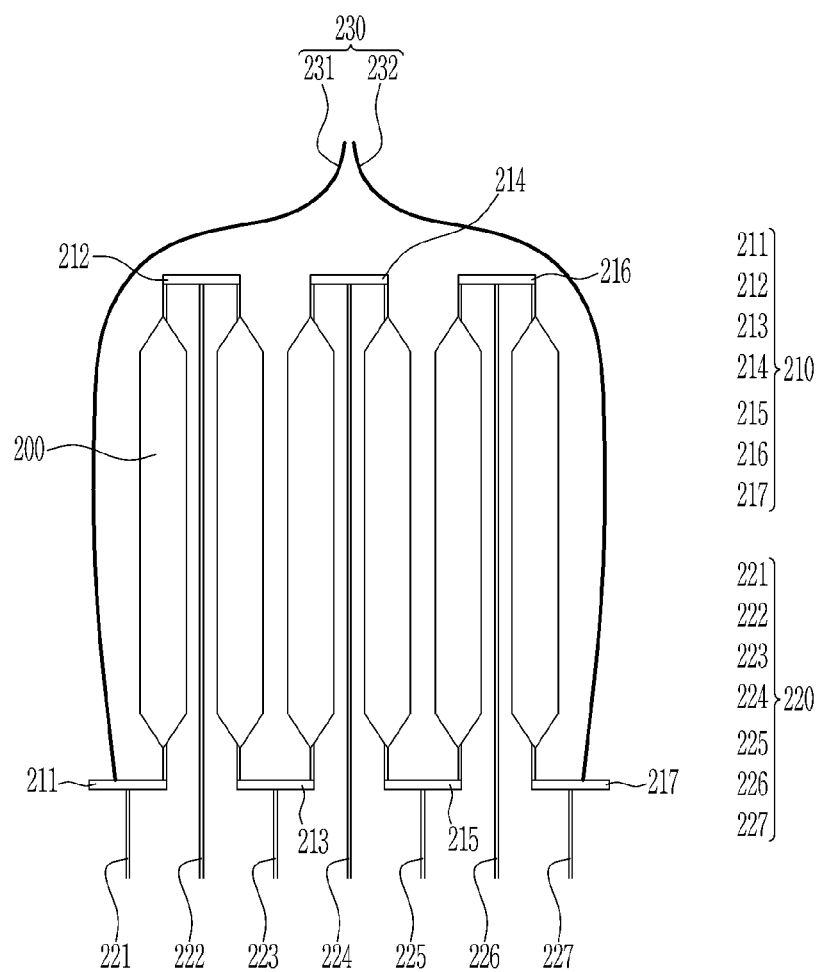
FIG. 2 illustrates a schematic view of a battery for an electric vehicle according to an exemplary embodiment of the present disclosure.

FIG. 1 illustrates a block diagram of an apparatus of detecting a thermal runaway of a battery for an electric vehicle according to an exemplary embodiment of the present disclosure. In addition, FIG. 2 illustrates a schematic view of a battery for an electric vehicle according to an exemplary embodiment of the present disclosure. As shown in FIG. 1 and FIG. 2, an apparatus 100 configured to detect a thermal runaway of a battery for an electric vehicle according to an exemplary embodiment of the present disclosure may include a plurality of battery cells 200, a main sensing line 220, an auxiliary sensing line 230, a battery management system 300, a controller 400, and a warning part 500.

Referring to FIG. 2, the plurality of battery cells 200 are stacked in a predetermined direction (for example, left and right directions or up and down directions), and respective battery cells 200 are connected to each other in series. The plurality of battery cells 200 connected in series configure a battery module 100. The plurality of battery cells 200 are connected in series through a high voltage (HV) line 210, and the HV line 210 may be implemented with a busbar.

The main sensing line 220 for measuring a voltage of each battery cell 200 is provided between the plurality of battery cells 200. The main sensing line 220 may be configured to measure the voltage of each battery cell 200 by branching from the HV line 210 connecting the plurality of battery cells 200 in series. The number of main sensing lines 220 is one more than the number of the plurality of battery cells 200. The main sensing line 220 is electrically connected to the battery management system 300, and the battery management system 300 may be configured to determine the voltage of each battery cell 200 through the voltage transmitted through the main sensing line 220.

The auxiliary sensing lines 230 branch from respective ends (for example, an input line and an output line) of the battery module 100 including the plurality of battery cells 200. The auxiliary sensing line 230 is electrically connected to a plurality of battery management systems 300, and the battery management systems 300 may be configured to determine the entire voltage of the battery module 100 through the voltage transmitted through the auxiliary sensing line 230.

For example, as shown in FIG. 2, when the number of battery cells 200 is 6 (a first battery cell (#1) to a sixth battery cell (#6)), respective battery cells 200 are connected in series through the HV lines 210. In other words, the HV line 210 may include a first HV line 211 that is an input line (or an input line of a battery module) of a first battery cell 200, a second HV line 212 connecting the first battery cell 200 and a second battery cell 200, a third HV line 213 connecting the second battery cell 200 and a third battery cell 200, a fourth HV line 214 connecting the third battery cell 200 and a fourth battery cell 200, a fifth HV line 215 connecting the fourth battery cell 200 and a fifth battery cell 200, a sixth HV line 216 connecting the fifth battery cell 200 and a sixth battery cell 200, and a seventh HV line 217 that is an output line of the sixth battery cell 200.

In particular, the main sensing line 220 may include a first main sensing line 221 branching from the first HV line 211, a second main sensing line 222 branching from the second HV line 212, a third main sensing line 223 branching from the third HV line 213, a fourth main sensing line 224 branching from the fourth HV line 214, a fifth main sensing line 225 branching from the fifth HV line 215, a sixth main sensing line 226 branching from the sixth HV line 216, and a seventh main sensing line 227 branching from the seventh HV line 217. In addition, the auxiliary sensing line 230 may include a first auxiliary sensing line 231 branching from the first HV line 211 and a seventh main sensing line 220 branching from the seventh HV line 217.

Figure 3:
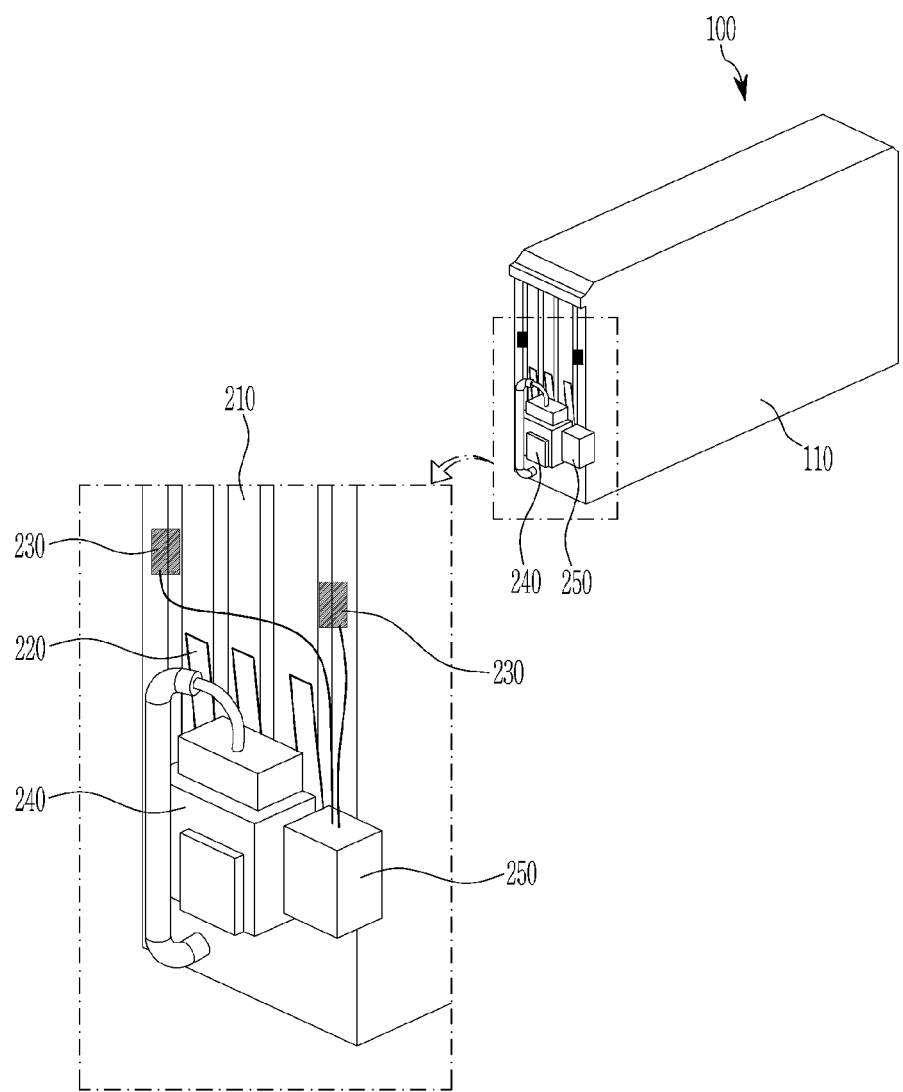
FIG. 3 illustrates a perspective view of an exterior case of a battery for an electric vehicle according to an exemplary embodiment of the present disclosure.
Figure 4:
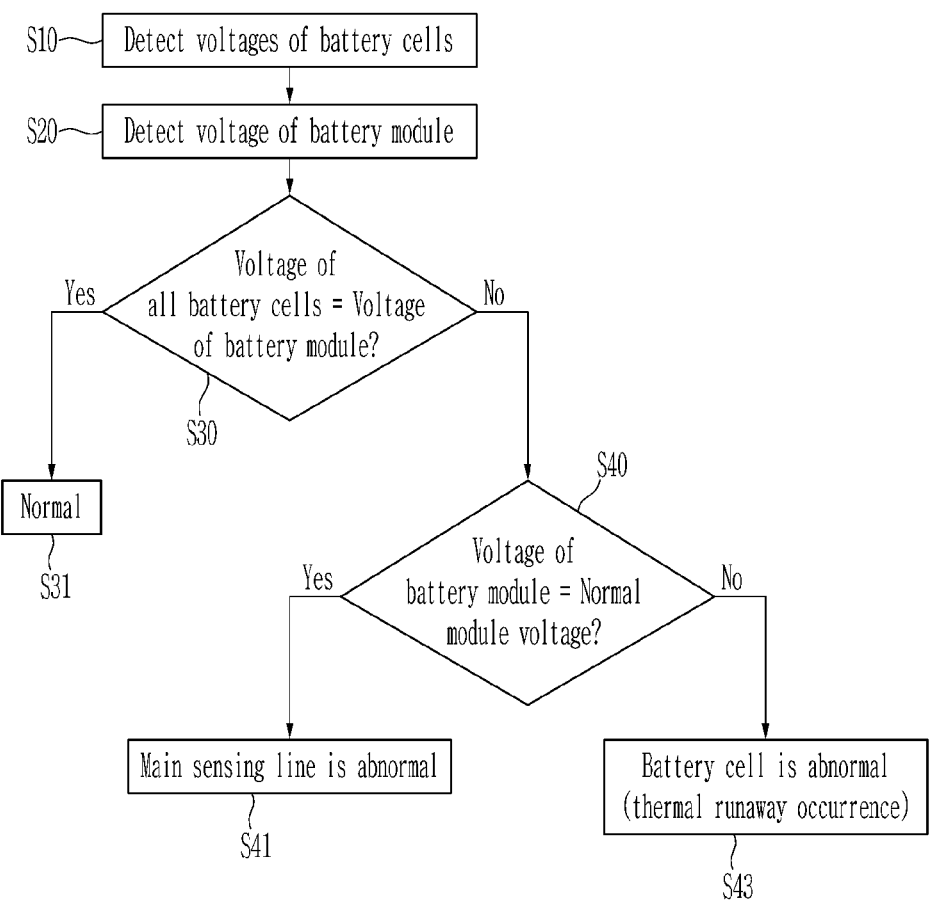
FIG. 4 illustrates a flowchart of a method of detecting a thermal runaway of a battery for an electric vehicle according to an exemplary embodiment of the present disclosure.

Referring to FIG. 3, the main sensing line 220 is electrically connected to the battery management system 300 through a main connector 240 provided in the exterior case 110 accommodating the battery module 100. In addition, the auxiliary sensing line 230 is electrically connected to the battery management system 300 through an auxiliary connector 250 provided in the exterior case 110. The main connector 240 and the auxiliary connector 250 may be separately implemented, and as necessary, the main connector 240 and the auxiliary connector 250 may be implemented as one integrated connector.

The battery management system (BMS) 300 may be configured to measure the voltages of the battery cells 200 and the voltage of the battery module 100 transmitted through the main sensing line 220 and the auxiliary sensing line 230 through a voltage sensor, and manage each battery cell 200 and the battery module 100 to be maintained in an optimal state. In other words, the battery management system 300 may be configured to detect the voltage of each battery cell 200 through the main sensing line 220 branching between the plurality of battery cells 200, and detect the voltage of the battery module 100 (e.g., the voltage of all the battery cells 200) through the auxiliary sensing line 230 branching from the input/output line of the battery module 100.

In addition, the battery management system 300 may be configured to measure the remaining capacity of the battery, maintain a state of charge (SOC) of the battery at an appropriate level, and measure and manage a temperature of the battery. The controller 400 is electrically connected to the battery management system 300, and may be configured to compare the voltage of each battery cell 200 transmitted from the battery management system 300 with the voltage of the battery module 100 to determine whether the battery cell 200 is in thermal runaway, and when the thermal runaway occurs, the controller 400 may be configured to generate an alarm to an occupant of a vehicle through the warning part 500.

Accordingly, the controller 400 may be provided as at least one processor executed by a predetermined program, and the predetermined program is configured to perform respective steps of a method of detecting a thermal runaway of a battery for an electric vehicle according to an exemplary embodiment of the present disclosure. The warning part 500 may be implemented through a center fascia or speaker provided in the vehicle.

Hereinafter, the operation of the apparatus of detecting the thermal runaway of the battery for the electric vehicle according to the exemplary embodiment of the present disclosure as described above will be described in detail with reference to the accompanying drawings. The battery management system 300 may be configured to detect the voltage of each battery cell 200 through the main sensing line 220, and detect the voltage of all the battery cells 200 by summing the voltages of the plurality of battery cells 200 (S10).

In particular, the voltage of each battery cell 200 may be detected through the main sensing line 220 that is electrically connected to the HV line 210. For example, the voltage of the first battery cell 200 may be measured as a difference in voltage between the first main sensing line 221 branching from the first HV line 211 and the second main sensing line 222 branching from the second HV line 212. In addition, the voltage of the second battery cell 200 may be measured using a difference in voltage between the second main sensing line 222 branching from the second HV line 212 and the third main sensing line 223 branching from the third HV line 213. Accordingly, the voltage of each battery cell 200 may be measured, and the voltage of all the battery cells 200 (or the voltage of the battery module 100) may be measured by summing the voltages of respective battery cells 200.

In addition, the battery management system 300 may be configured to detect the voltage of the battery module 100 (the voltage of all the battery cells 200) through the auxiliary sensing line 230 (S20). In particular, the voltage of the battery module 100 may be detected through the auxiliary sensing line 230 that is electrically connected to the HV line 210. For example, the voltage of the battery module 100 may be detected by a difference in voltage between the first auxiliary sensing line 231 branching from the first HV line 211 and the second auxiliary sensing line 232 branching from the second HV line 212.

The voltage of each battery cell 200 detected by the battery management system 300 and the voltage of the battery module 100 are transmitted to the controller 400. The controller 400 may be configured to compare the voltage of all the battery cells 200 detected through the main sensing line 220 with the voltage of the battery module 100 detected through the auxiliary sensing line 230 (S30).

When the voltage of all the battery cells 200 detected through the main sensing line 220 is the same as the voltage of the battery module 100 detected through the auxiliary sensing line 230, the controller 400 may be configured to determine that respective battery cells 200 and the main sensing line 220 configuring the battery module 100 normally operate (S31). When the voltage of all the battery cells 200 detected through the main sensing line 220 is different from the voltage of the battery module 100 detected through the auxiliary sensing line 230, the controller 400 may be configured to determine whether the voltage of the battery module 100 detected through the auxiliary sensing line 230 is the same as the normal module voltage (S40).

When the voltage of the battery module 100 detected through the auxiliary sensing line 230 is the same as the normal module voltage, the controller 400 may be configured to determine that respective battery cells 200 configuring the battery module 100 normally operate (S41). In particular, the battery cell 200 operates normally, but since an error has occurred in the main sensing line 220, the controller 400 may be configured to determine that an abnormality has occurred in the main sensing line 220, and the controller may be configured to output a warning to the occupant of the vehicle that an abnormality has occurred in the main sensing line 220 through the warning part 500.

For example, when each battery cell 200 operates normally and when an abnormality occurs in the seventh main sensing line 227, the voltage of the sixth battery cell 200 detected by the sixth main sensing line 226 and the seventh main sensing line 227 is different from a normal voltage thereof. Therefore, when the voltage of the battery cell 200 is measured only through the main sensing line 220, a difference from an actual situation occurs. However, in this case, when the voltage of the battery module 100 is detected through the auxiliary sensing line 230, the voltage of the battery module 100 is detected to be the same as the normal module voltage. Accordingly, the controller 400 may be configured to determine that the battery cell 200 operates normally and an abnormal situation (for example, a problem of connection between the HV line 210 and the main sensing line 220, or a problem of the main sensing line 220 itself) occurs only in the main sensing line 220.

When the voltage of the battery module 100 detected through the auxiliary sensing line 230 is different by a predetermined voltage or more (for example, a difference of 25% or more) from the normal module voltage, the controller 400 may be configured to determine that an abnormal situation has occurred (for example, a thermal runaway has occurred) in the battery cell 200 (S43). This case may be one in which an abnormal situation such as a thermal runaway occurs in the battery cell 200 so that the voltage of the battery module 100 may decrease rapidly.

Figure 5:
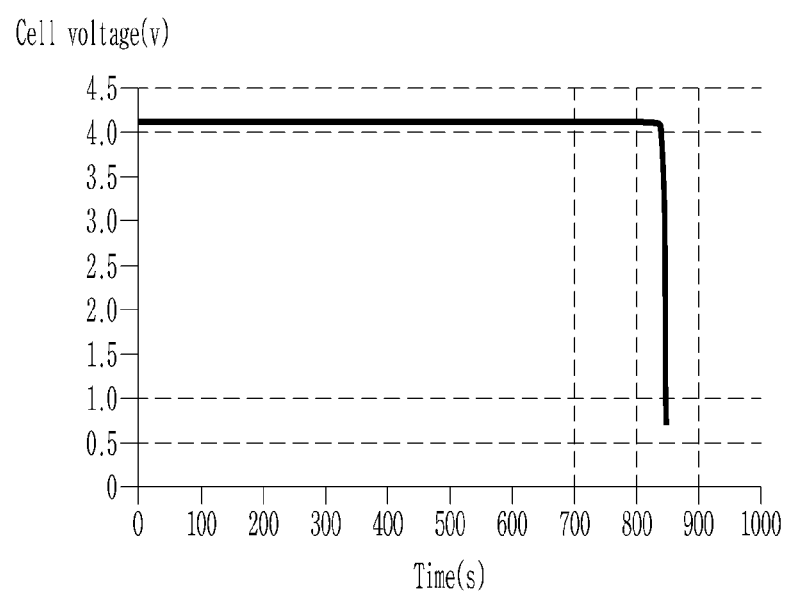
FIG. 5 illustrates a graph of a voltage of a battery cell according to an exemplary embodiment of the present disclosure.
Figure 6:
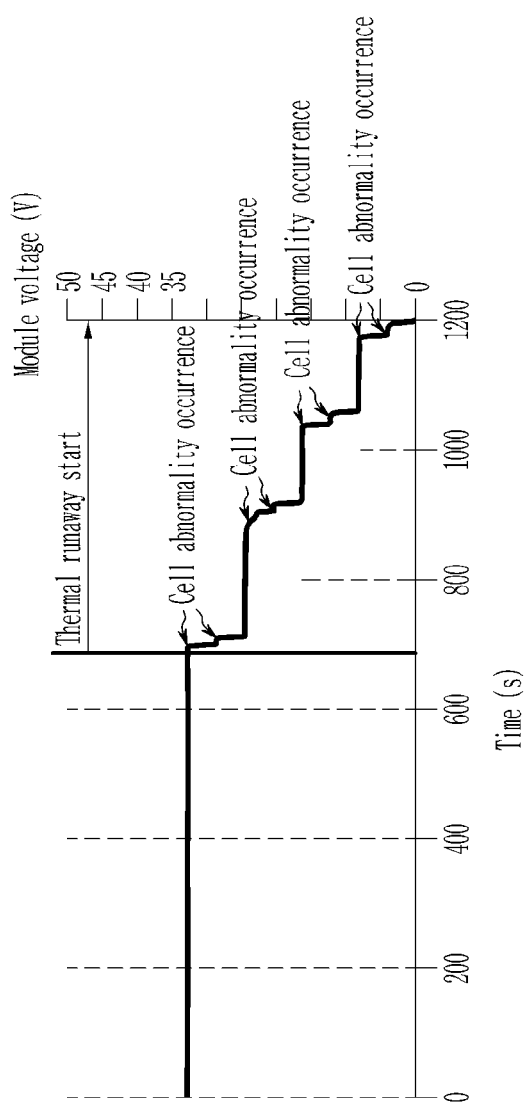
FIG. 6 illustrates a graph of a voltage of a battery module according to an exemplary embodiment of the present disclosure.

When the thermal runaway occurs in the battery cell 200, the voltage of the battery cell 200 rapidly decreases (see FIG. 5). In addition, when the thermal runaway occurs in one battery cell 200 configuring the battery module 100, a thermal runaway occurs in the battery cell 200 adjacent thereto. Due to this, the voltage of the battery module 100 becomes less than the normal module voltage (see FIG. 6). When the thermal runaway occurs in the battery cell 200, a swelling phenomenon in which the battery swells occurs, and in an extreme situation, gas may be generated from the battery, and a fire may occur. A very dangerous situation may occur for occupants in the vehicle due to a cascade of fires in the vehicle due to the battery fire.

Therefore, when the occurrence of the thermal runaway in the battery cell 200 is detected by comparing the voltage of all the battery cells 200 detected through the main sensing line 220 with the voltage of the battery module 100 detected through the auxiliary sensing line 230, the controller 400 may be configured to output a notification to the occupants of the vehicle through the warning part 500 of this fact, so that it is possible to protect the occupants from the thermal runaway of the battery cell 200 and the resulting vehicle fire.

According to the apparatus and method of detecting the thermal runaway of the battery for the electric vehicle according to the exemplary embodiment of the present disclosure as described above, it is possible to compare the voltage of all the battery cells 200 detected through the main sensing line 220 and the voltage of the battery module 100 detected through the auxiliary sensing line 230 to detect an abnormal situation (for example, thermal runaway) of the battery cell 200 and an abnormal situation of the main sensing line 220. In addition, since there is no need to include a separate temperature sensor for detecting the thermal runaway, it is possible to reduce a manufacturing cost of a vehicle.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

DESCRIPTION OF SYMBOLS

100: battery module
110: exterior case
200: battery cell
210: HV line
220: main sensing line
230: auxiliary sensing line
240: main connector
250: auxiliary connector
300: battery management system
400: controller
500: warning part

What is claimed is:

1. An apparatus of detecting a thermal runaway of a battery for an electric vehicle, comprising:
    a plurality of battery cells connected in series through a high voltage (HV) line;
    a battery module including the plurality of battery cells;
    a plurality of main sensing lines electrically connected to the HV line between the plurality of battery cells to measure voltages of respective battery cells;
    a plurality of auxiliary sensing lines respectively connected to an HV line as an input line of the battery module and to an HV line as an output line of the battery module to measure a voltage of the battery module;
    wherein a voltage of all the battery cells is detected by summing voltages of respective battery cells detected through the main sensing line;
    wherein a voltage of the battery module detected through the auxiliary sensing line is detected; and
    a controller configured to:
        compare the voltage of all the battery cells and the voltage of the battery module to determine whether the battery cell is abnormal; and
        in response to determining that the voltage of all the battery cells and the voltage of the battery module are different, determine whether the battery cell or the main sensing line is abnormal by comparing the voltage of the battery module detected through the auxiliary sensing line with a normal module voltage.

2. The apparatus of detecting the thermal runaway of the battery for the electric vehicle of claim 1, wherein the controller is configured to determine that all the battery cells of the battery module operate normally when the voltage of all the battery cells and the voltage of the battery modules are the same.

3. The apparatus of detecting the thermal runaway of the battery for the electric vehicle of claim 1, wherein the controller is configured to determine that an abnormality occurs in the main sensing line in response to determining that the voltage of the battery module detected through the auxiliary sensing line is the same as the normal module voltage.

4. The apparatus of detecting the thermal runaway of the battery for the electric vehicle of claim 3, further comprising:
    a warning part configured to output a notification to an occupant of an abnormality in the main sensing line.

5. The apparatus of detecting the thermal runaway of the battery for the electric vehicle of claim 1, wherein the controller is configured to determine that an abnormal situation occurs in the battery cell in response to determining the voltage of the battery module detected through the auxiliary sensing line is different by a predetermined voltage or more from the normal module voltage.

6. The apparatus of detecting the thermal runaway of the battery for the electric vehicle of claim 5, further comprising:
    a warning part configured to output a notification to an occupant of an abnormality in the battery cell.

7. A method of detecting a thermal runaway of a battery for an electric vehicle, wherein the electric vehicle includes a battery module including a plurality of battery cells connected in series through a high voltage (HV) line, comprising:
    detecting, by a controller, voltages of respective battery cells through a plurality of main sensing lines electrically connected to the HV line;
    detecting, by the controller, a voltage of all the battery cells by summing the voltages of respective battery cells;

detecting, by the controller, a voltage of the battery module through a plurality of auxiliary sensing lines electrically connected to the HV line;

determining, by the controller, an abnormality of the battery cell and an abnormality of the main sensing line by comparing the voltage of all the battery cells and the voltage of the battery module; and in response to determining that the voltage of all the battery cells and the voltage of the battery module are different, determining an abnormality of the battery cell or the main sensing line by comparing the voltage of the battery module detected through the auxiliary sensing line with a normal module voltage.

8. The method of detecting the thermal runaway of the battery for the electric vehicle of claim 7, further comprising:

determining, by the controller, that the battery cell and the main sensing line normally operate in response to determining that the voltage of all the battery cells and the voltage of the battery modules are the same.

9. The method of detecting the thermal runaway of the battery for the electric vehicle of claim 7, further comprising:

in response to determining that the voltage of the battery module detected through the auxiliary sensing line is the same as the normal module voltage, determining that an abnormality occurs in the main sensing line.

10. The method of detecting the thermal runaway of the battery for the electric vehicle of claim 7, further comprising:

in response to determining that the voltage of the battery module detected through the auxiliary sensing line is different by a predetermined voltage or more from the normal module voltage, determining that an abnormal situation occurs in the battery cell.

11. The method of detecting the thermal runaway of the battery for the electric vehicle of claim 10, further comprising notifying an occupant of an abnormality in the main sensing line or an abnormality in the battery cell.

12. An apparatus of detecting a thermal runaway of a battery for an electric vehicle, comprising:

a plurality of main sensing lines electrically connected to a high voltage (HV) line between a plurality of battery cells to measure voltages of the plurality of battery cells connected in series;

a plurality of auxiliary sensing lines respectively connected to an HV line as an input line of a battery module and to an HV line as an output line of the battery module to measure a voltage of the battery module;

a battery management system configured to detect voltages of respective battery cells through the main sensing line and detects a voltage of the battery module through the auxiliary sensing line; and a controller configured to determine whether the main sensing line is abnormal through the voltages of respective battery cells and the voltage of the battery module, wherein the controller is configured to execute a series of instructions that includes:

detecting a voltage of all the battery cells by summing the voltages of respective battery cells;

determining an abnormality of the battery cell and an abnormality of the main sensing line by comparing the voltage of all the battery cells and the voltage of the battery module;

determining an abnormality of the battery cell or the main sensing line by comparing, in response to determining that the voltage of all the battery cells and the voltage of the battery module are different, the voltage of the battery module detected through the auxiliary sensing line with a normal module voltage.

13. The apparatus of detecting the thermal runaway of the battery for the electric vehicle of claim 12, wherein the controller is configured to determine that the battery cell and the main sensing line normally operate in response to determining that the voltage of all the battery cells and the voltage of the battery module are the same.

14. The apparatus of detecting the thermal runaway of the battery for the electric vehicle of claim 12, wherein in response to determining that the voltage of the battery module detected through the auxiliary sensing line is the same as the normal module voltage, the controller is configured to determine that an abnormality occurs in the main sensing line.

15. The apparatus of detecting the thermal runaway of the battery for the electric vehicle of claim 12, wherein in response to determining that the voltage of the battery module detected through the auxiliary sensing line is different by a predetermined voltage or more from the normal module voltage, the controller is configured to determine that an abnormal situation occurs in the battery cell.

\* \* \* \* \*